(12) United States Patent
Buynoski et al.

(10) Patent No.: US 6,787,436 B1
(45) Date of Patent: Sep. 7, 2004

(54) SILICIDE-SILICON CONTACTS FOR REDUCTION OF MOSFET SOURCE-DRAIN RESISTANCES

(75) Inventors: Matthew S. Buynoski, Palo Alto, CA (US); Witold Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/147,382

(22) Filed: May 15, 2002

(51) Int. Cl.$^7$ ............................................. H04L 21/425
(52) U.S. Cl. ................. 438/514; 438/520; 438/523; 438/528; 438/533; 438/630; 438/649; 438/650; 438/651; 438/655; 438/659; 438/664; 438/682; 438/683
(58) Field of Search ................................ 438/514, 520, 438/523, 528, 533, 630, 649–651, 655, 659, 664, 682–683

(56) References Cited

U.S. PATENT DOCUMENTS

| | | | | |
|---|---|---|---|---|
| 4,835,112 A | * | 5/1989 | Pfiester et al. ............... | 438/305 |
| 5,624,867 A | * | 4/1997 | Cheng et al. ................ | 438/659 |
| 5,858,867 A | * | 1/1999 | Hsia et al. ................... | 438/664 |
| 5,933,741 A | * | 8/1999 | Tseng .......................... | 438/655 |
| 6,372,566 B1 | * | 4/2002 | Kittl et al. ................... | 438/528 |
| 6,544,872 B1 | * | 4/2003 | Buynoski et al. ........... | 438/586 |
| 2002/0061639 A1 | * | 5/2002 | Itonaga ........................ | 438/683 |

* cited by examiner

*Primary Examiner*—Lynne A. Gurley
(74) *Attorney, Agent, or Firm*—Farjami & Farjami LLP

(57) ABSTRACT

Methods for reducing the contact resistance presented by the interface between a silicide and a doped silicon region are presented. In a first method, a silicide layer and a doped silicon region form an interface. Either a damage-only species or a heavy, metal is implanted through the silicide layer into the doped silicon region immediately adjacent the interface. In a second method, a second metal is added to the refractory metal before formation of the silicide. After annealing the refractory metal and the doped silicon region, the second metal diffuses into the doped silicon region immediately adjacent the interface without forming additional phases in the silicide.

11 Claims, 4 Drawing Sheets

Figure 1 — Prior Art

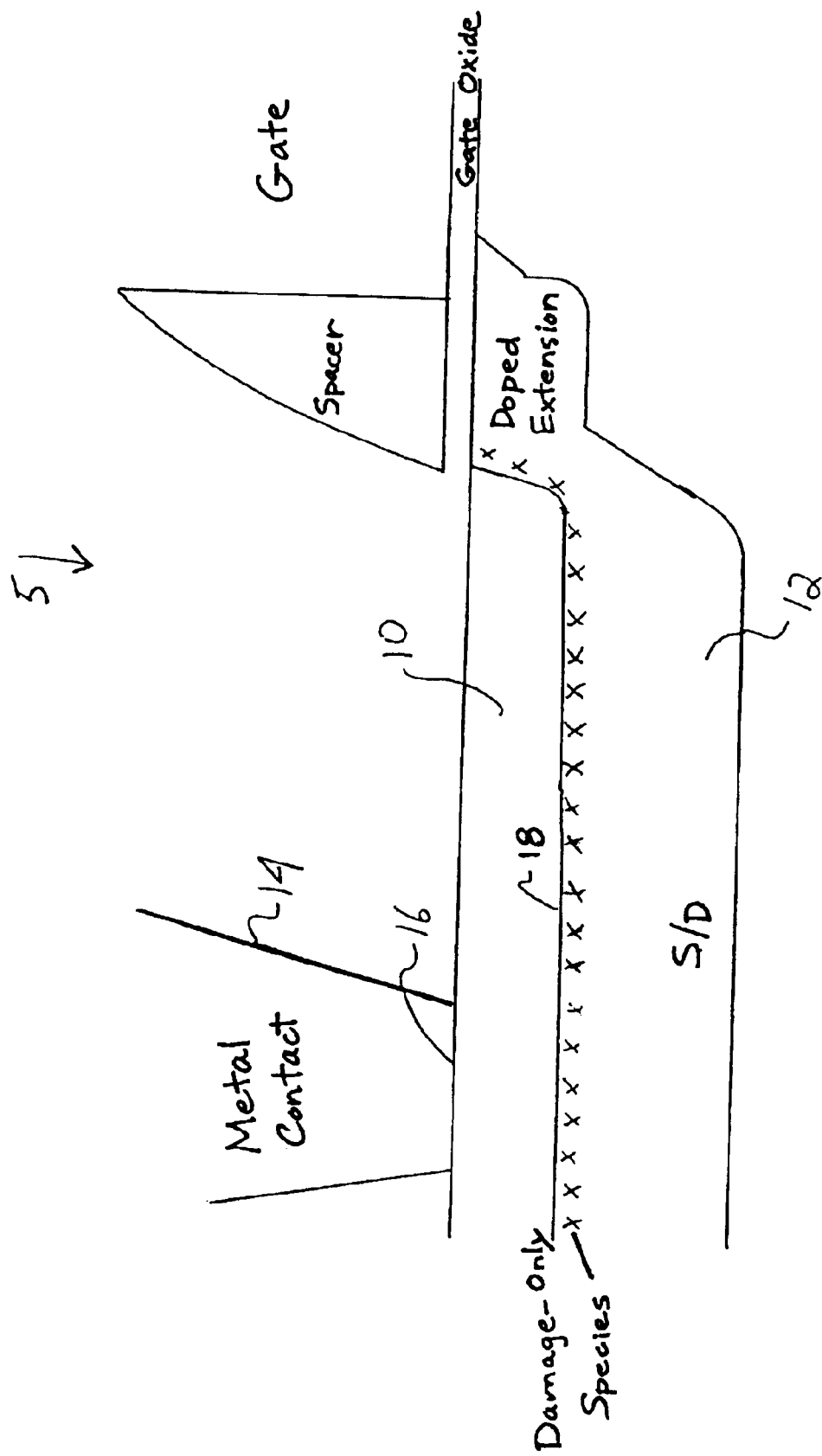

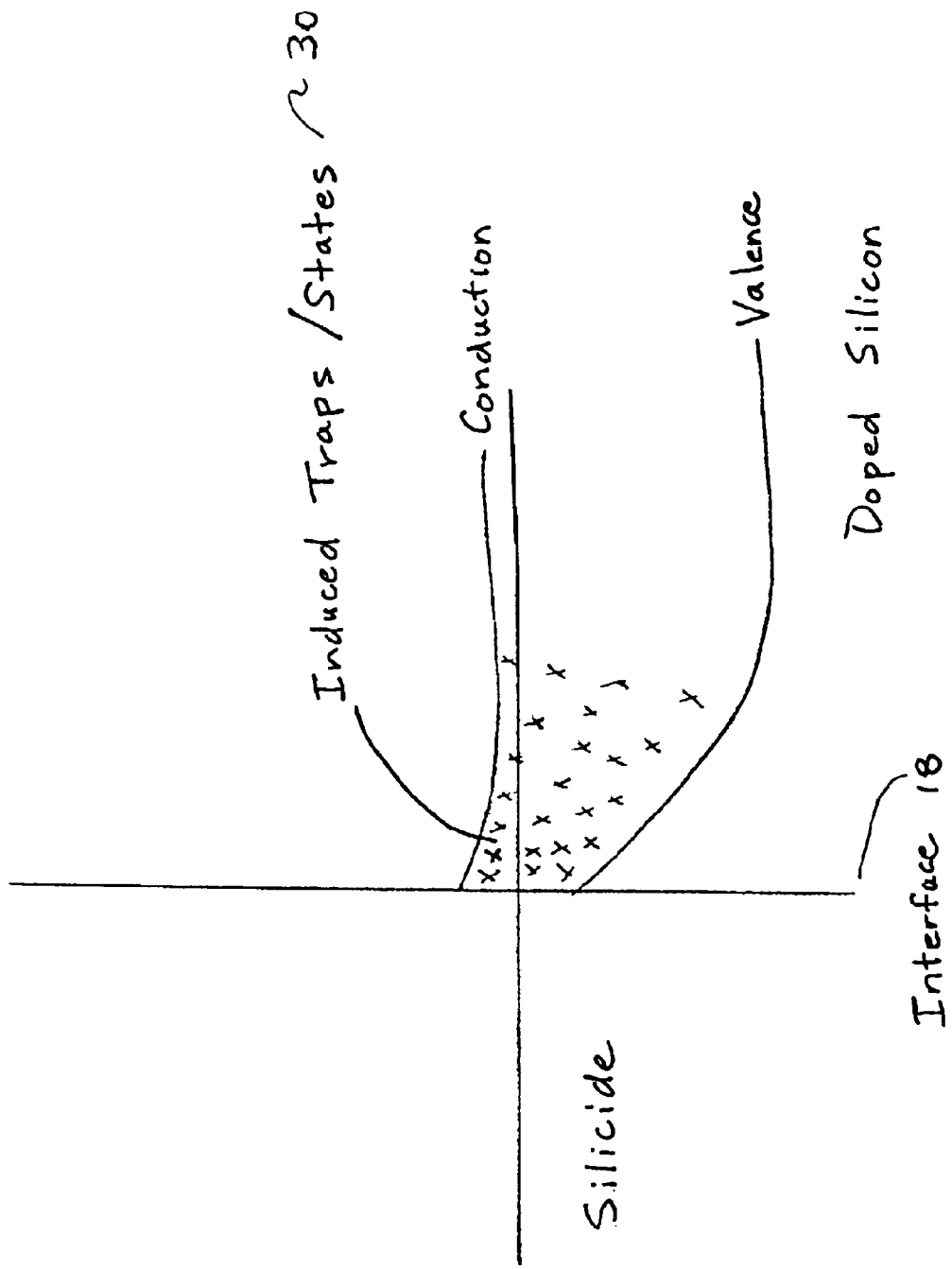

ced states or traps in the bandgap at the silicide/doped silicon interface to reduce the contact barrier.

SILICIDE-SILICON CONTACTS FOR REDUCTION OF MOSFET SOURCE-DRAIN RESISTANCES

TECHNICAL FIELD

This invention relates to MOSFETs with silicide contacts.

BACKGROUND

As VLSI devices continue to scale into the deep submicron region, interconnection delays limit circuit performance. Aluminum or polysilicon interconnections, because of their relatively slow conduction speed, exacerbate this problem. Because silicide conducts better than aluminum or silicon, the use of silicide interconnections has become widespread. Silicides are formed by combining silicon with a refractory metal, typically Ti, Co, or W. In addition to lowering the sheet resistance and forming ohmic contacts, suicides also offer high temperature thermal stability.

Despite the advantages offered by the suicides, certain disadvantages remain. For example, FIG. 1 illustrates a portion of a typical MOSFET 5 formed using a salicide process. A silicide region 10 lies above a doped source/drain region 12. To connect MOSFET 5 to other transistors in a circuit, a metal contact 14 also contacts silicide 10. Accordingly, between metal contact 14 and doped source/ drain region 12, there are two intermaterial interfaces. A first intermaterial interface 16 lies between metal contact 14 and silicide 10. The second intermaterial interface 18 lies between silicide 10 and doped source/drain region 12. Both these interfaces will have a "contact resistance" that is a consequence of the barrier that dissimilar materials in contact have.

FIG. 2 is a band diagram for silicide/doped silicon intermaterial interface 18. The valence and conduction bands for the silicide overlap as it is assumed to be fully metallic in character. However, the conduction and valence bands are separated in the doped silicon at the contact region illustrating the contact barrier at the interface. The contact resistances from this intermaterial interface leads to a loss of signal resulting in lower performance of the MOSFET device. Although a portion of the signal loss stems from the sheet resistivity ($\rho$) of the doped source drain region and the silicide region, the number of squares in a typical MOSFET is very low such that the contribution of resistance from these areas is relatively small. Similarly, the contact barrier from silicide/metal intermaterial interface 16 is small because silicides are metallic and metal/metal contact barriers are small. Thus, the contact barrier from silicide/doped silicon intermaterial interface emerges as the predominant contributor to the losses.

Accordingly, there is a need in the art for improved silicon silicide interfaces which minimize the loss encountered.

SUMMARY

In accordance with one aspect of the invention, a silicide layer and a doped silicon region form an interface. Either a damage-only species or a heavy metal is implanted through the silicide layer into the doped silicon region immediately adjacent the interface. The implanted species introduces traps or induce states in the bandgap of the doped silicon immediately adjacent the interface to reduce the contact barrier.

In accordance with a second aspect of the invention, a second metal is added to a refractory metal before formation of a silicide layer on a doped silicon region. After annealing the refractory metal and the doped silicon region, the second metal diffuses into the doped silicon region immediately adjacent the silicide/doped silicon interface without forming additional phases in the silicide. The diffused second metal introduces traps or induces states in the bandgap of the doped silicon immediately adjacent the interface to reduce the contact barrier.

DESCRIPTION OF THE DRAWINGS

FIG. 3 illustrates the MOSFET of FIG. 1 after implantation of a damage-only species according to one embodiment of the invention.

FIG. 4 is a bandgap diagram for the silicide/doped silicon interface of FIG. 3.

DETAILED DESCRIPTION

Figure 1:
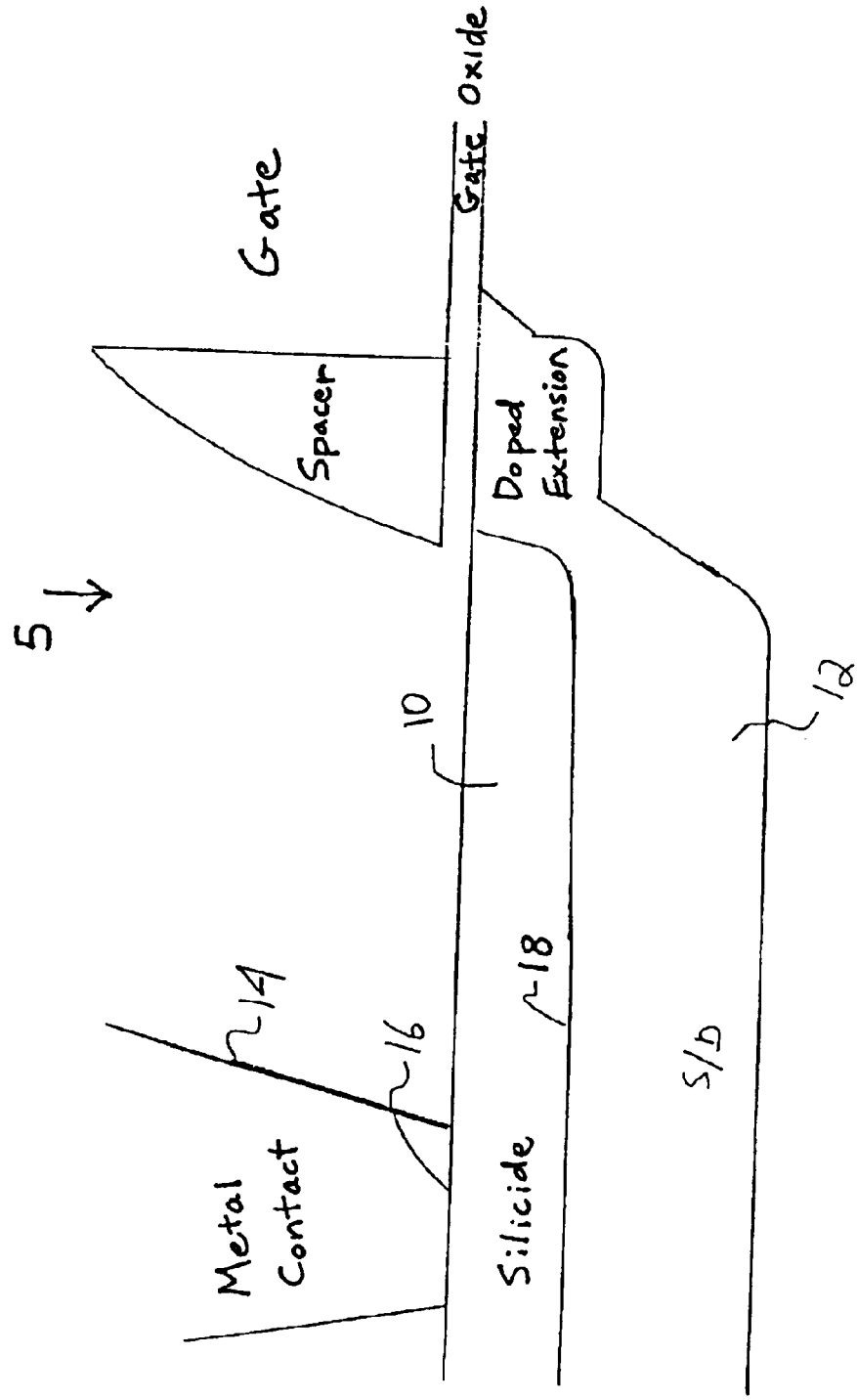
FIG. 1 is a schematic illustration of a portion of a prior art MOSFET.
Figure 2:
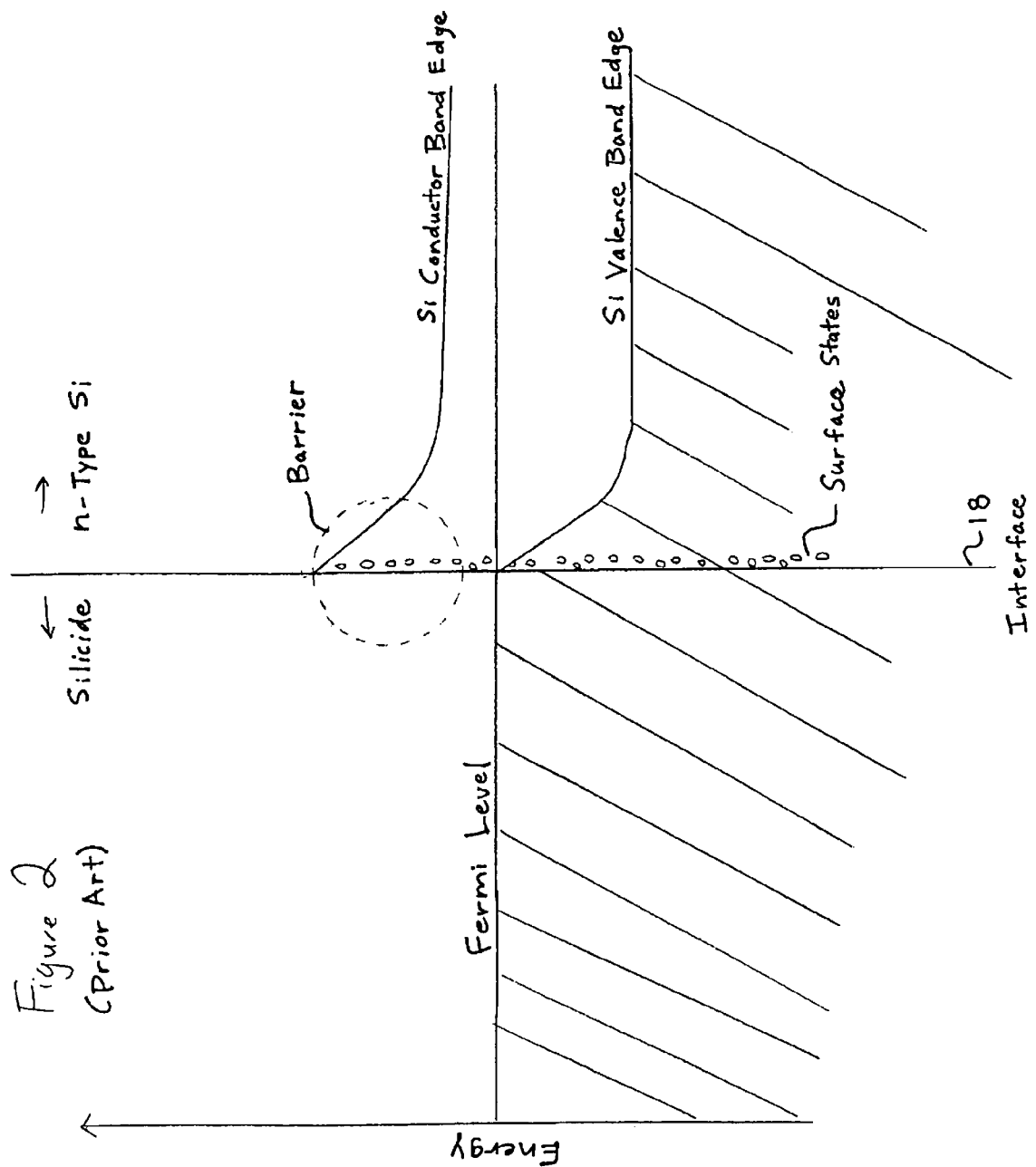
FIG. 2 is a band diagram for a prior art silicide/doped silicon interface.

The present invention provides methods for effectively removing the contact resistance from a silicide/doped silicon interface by introducing a set of induced states or traps in the silicon bandgap at the silicide/doped silicon interface. As used herein, a contact barrier for a silicide/doped silicon interface having been reduced according to the invention will be denoted as a "wrecked barrier." The inventive methods disclosed herein may be classified into two approaches depending upon whether the silicide has been formed. In the first approach, a species is implanted through the formed silicide into the doped silicon region to wreck the barrier. In the second approach, a species is added during the formation of the silicide to wreck the barrier.

Regardless of the approach adopted, the silicide may be formed on the doped silicon region according to all conventional techniques. Thus, the silicide may be formed by depositing a refractory metal on the doped silicon region, and then annealing the two layers at a suitably high temperature to form a silicide at the interface. Alternatively, a refractory metal target may be sputtered over the doped silicon region before annealing. In addition, the silicide may be formed by chemical vapor deposition of a refractory metal and silicon onto the doped silicon region or by other suitable methods. It will be appreciated as well that the silicide may be formed on a silicon region and the silicon region doped after formation of the silicide.

The first approach to wrecking the barrier, namely implantation through a formed silicide layer, may be broadly classified into two methods. In a first method, a damage-only species is implanted through the formed silicide into the doped silicon region. By implanting the damage-only species after formation of the silicide, the crystal damage is not annealed by the silicide formation heat treatment. As implied by the name, a damage-only species wrecks the barrier by damaging the crystal structure in the doped silicon region and acts as neither an electron donor nor an electron acceptor with respect to the silicon lattice. Suitable damage-only species include Si, Ge, Kr, Xe, Ar, Ne and He. Because the goal is to wreck the barrier rather than change the electrical characteristics of the doped silicon region with respect to the rest of the transistor in which it resides, the implantation energy is chosen to place the peak of the crystal damage in the doped silicon region immediately below the silicide/doped silicon interface. For example, the peak of the crystal damage may be placed about 0 to 150 Å, and more preferably 0 to 50 Å, below the silicide/doped silicon interface. As such, the energy required for the implantation will depend upon the silicide type, the silicide depth, and the effective range of the implanted species in the silicide and will typically range from 5E13 to 1E15/cm².

In a second method, a heavy metal rather than a damage-only species is implanted through the silicide layer into the doped silicon region. Suitable heavy metals include Cu, Ag, Au, and Fe depending upon the temperature used for subsequent processing steps. For example, Au will diffuse fairly quickly at high temperatures in silicon and can only be used if the subsequent processing steps occur at approximately 500° C. or less. As discussed above, because the goal is to wreck the barrier without affecting the electrical characteristics of the doped silicon region in relation to the remainder of the circuit, the implanted metal is concentrated immediately below the silicide/doped silicon interface. Note that a heavy metal species will not only damage the doped silicon crystal lattice but will also electrically interact with the lattice to create traps and states in the doped silicon interface bandgap. The peak crystal damage tends to occur slightly behind the peak implantation concentration as the implanting species crash into the lattice before coming to rest. Depending upon what is the predominant effect provided by the heavy metal species (electrical interaction or damage), the implantation energy may be adjusted to place either the peak of the damage or the peak concentration of the heavy metal species immediately below the silicide/doped silicon interface.

In the second approach to wrecking the barrier, a second metal is added during the formation of the silicide layer. A number of conventional approaches to forming silicide layers using a refractory metal may be used. The second metal and the refractory metal may be deposited on the doped silicon region and then annealed. Alternatively, the second metal may be added to a refractory metal target that then is sputter deposited onto the doped silicon region. In addition, chemical vapor deposition using gaseous reactants of the second metal, refractory metal, and silicon may be performed onto the doped silicon region. Generally, the formation of the silicide will tend to sweep the second metal to the silicide/doped silicon interface where it will then diffuse into the doped silicon region and concentrate immediately below the interface, typically at a depth of 0 to 150 Å, and more preferably from 0 to 50 Å. Depending upon the temperature for the annealing and subsequent processing steps, a wide variety of metals may be used for the second metal such as Au, Fe, Cu, Cd, Hg, and others. Because of its mobility with higher temperatures, the use of Au would be contraindicated if subsequent processing temperatures exceeded 500° C. To avoid forming additional phases in the silicide layer, the second metal concentration should be approximately 1% or less. In contrast to the first approach, the diffused second metal species will not have any damage effects. Instead, it must wreck the barrier through electric interaction with the doped silicon lattice, providing traps and states in the doped silicon interface bandgap.

Regardless of the approach used, a species has been implanted or diffused into the doped silicon layer. As a result, either crystal lattice damage or the added species will have a peak concentration just below the silicide layer, typically at a depth of 0 to 150 Å, and more preferably 0 to 50 Å. For example, turning now to FIG. 3, the portion of the MOSFET 5 discussed with respect to FIG. 1 is shown having had a damage only species implanted through silicide layer 10 to wreck the barrier provided by silicide/doped silicon interface 18. FIG. 4 illustrates the traps and states 30 that result in the bandgap of the doped silicon region near interface 18 (for clarity the conduction and valence bands in the silicide region are not illustrated). The goal is to so flood the bandgap near interface 18 with enough traps and states 30 to render the contact barrier easily permeable to electrons.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method of reducing the contact resistance between a silicide layer and a doped silicon region, wherein the silicide layer and the doped silicon region form an interface comprising:

implanting a species through the silicide layer into the doped silicon region immediately below the interface after formation of the suicide layer, wherein the implanted species forms traps and induces states in the bandgap of the doped silicon region immediately below the interface such that a contact barrier between the silicide layer and the doped silicon region is reduced.

2. The method of claim 1, wherein the species is a heavy metal.

3. The method of claim 2, wherein the heavy metal is chosen from the group consisting of Cu, Ag, Au, and Fe.

4. The method of claim 3, wherein after the implanting act, the implanted heavy metal has a peak concentration in the doped silicon region within 150 Å of the interface.

5. The method of claim 3, wherein after the implanting act, the implanted heavy metal has a peak concentration in the doped silicon region within 50 Å of the interface.

6. The method of claim 3, wherein after the implanting act, the implanted heavy metal has damaged the crystal lattice of the doped silicon region such that the peak concentration of the damage occurs within 50 Å of the interface.

7. A method of reducing the contact resistance between a silicide layer and a doped silicon region, wherein the silicide layer and the doped silicon region form an interface comprising:

implanting a species through the silicide layer into the doped silicon region immediately below the interface after formation of the silicide layer, wherein the implanted species reduces a contact barrier between the silicide layer and the doped silicon region by causing crystal structure damage in the doped silicon region immediately below the interface, wherein the crystal structure damage is not annealed by a silicide formation heat treatment.

8. The method of claim 7, wherein the species is a damage-only species.

9. The method of claim 8, wherein the damage-only species is selected from the group consisting of Si, Ge, Kr, Xe, Ar, Ne and He.

10. The method of claim 9, wherein, after the implanting act, the implanted damage-only species has a peak concentration in the doped silicon region within 150 Å of the interface.

11. The method of claim 9, wherein after the implanting act, the implanted damage-only species has a peak concentration in the doped silicon region within 50 Å of the interface.

* * * * *